United States Patent
Crooks

(10) Patent No.: US 12,021,539 B1
(45) Date of Patent: Jun. 25, 2024

(54) PHASE LOCKED LOOP FREQUENCY SYNTHESIZER WITH TRANSLATION REFERENCE LOOP

(71) Applicant: Signal Hound, LLC., Battle Ground, WA (US)

(72) Inventor: Justin Crooks, Battle Ground, WA (US)

(73) Assignee: Signal Hound, LLC, Battle Ground, WA (US)

( * ) Notice: Subject to any disclaimer, the term of this patent is extended or adjusted under 35 U.S.C. 154(b) by 0 days.

(21) Appl. No.: 18/126,380

(22) Filed: Mar. 24, 2023

Related U.S. Application Data

(60) Provisional application No. 63/324,077, filed on Mar. 26, 2022.

(51) Int. Cl.
*H03L 7/093* (2006.01)
*H03L 7/099* (2006.01)
*H03L 7/18* (2006.01)

(52) U.S. Cl.
CPC ............ *H03L 7/093* (2013.01); *H03L 7/0991* (2013.01); *H03L 7/18* (2013.01)

(58) Field of Classification Search
CPC .......... H03L 7/093; H03L 7/0991; H03L 7/18
See application file for complete search history.

(56) References Cited

U.S. PATENT DOCUMENTS

| | | | |
|---|---|---|---|
| 2007/0279109 A1 | 12/2007 | Kirschenmann | |
| 2013/0278303 A1* | 10/2013 | Chen | H03L 7/085 327/156 |
| 2013/0308735 A1* | 11/2013 | Namdar-Mehdiabadi | H03L 7/0895 375/376 |
| 2014/0177770 A1* | 6/2014 | Katumba | H03L 7/093 375/374 |
| 2020/0195255 A1* | 6/2020 | Fan | H03L 7/093 |

FOREIGN PATENT DOCUMENTS

| CN | 102651649 A | * | 8/2012 |
| CN | 105141310 A | * | 12/2015 |
| CN | 116827340 A | * | 9/2023 |

OTHER PUBLICATIONS

Analog Devices, Translation Phase Locked Loop Synthesizer with Low Phase Noise Rev. 0, Circuit Note CN-0369, Nov. 2016, pp. 1-8, Analog Devices, Norwood, MA, USA.

* cited by examiner

*Primary Examiner* — Adam D Houston
(74) *Attorney, Agent, or Firm* — Rylander & Associates, PC; Philip R. M. Hunt

(57) ABSTRACT

A translation reference loop frequency synthesizer for generating an output signal with sub-Hz frequency steps over a full octave. The synthesizer has a phase lock loop circuit and a translation reference loop. The phase lock loop circuit generates a phase lock oscillator output signal based on a phase lock feedback signal and a phase lock reference signal. The translation reference loop generates the phase lock reference signal based on mixing a translation reference frequency signal and a translation reference loop divided signal. The translation reference loop includes a series of translation loop dividers for generating the translation reference loop divided signal by dividing a frequency of the phase lock oscillator output signal. The translation reference loop includes a translation reference frequency generator for generating the translation reference frequency signal.

16 Claims, 4 Drawing Sheets

PHASE LOCKED LOOP FREQUENCY SYNTHESIZER WITH TRANSLATION REFERENCE LOOP

CROSS-REFERENCE TO RELATED APPLICATIONS

This application claims the benefit of U.S. Provisional Application No. 63/324,077, filed 2022 Mar. 26, incorporated herein by reference.

TECHNICAL FIELD

This specification relates to phase locked loop circuits. More particularly, the present specification relates to translation phase locked loop circuits.

BACKGROUND

A phase lock loop circuit 1 (see FIG. 1) is a circuit with a phase lock (voltage controlled) oscillator 10 ($VCO_{PLL}$) that generates a phase lock oscillator output signal 86 whose phase is related to the phase of a phase lock reference signal 76. The phase lock loop circuit 1 is configured for keeping the frequency of the phase lock oscillator output signal 86 ($F_{VCO}$) at the same frequency as the phase lock reference signal 76 ($F_{REF}$) or at a multiple thereof. The phase lock loop circuit 1 has a phase frequency detector 2 which compares the phase lock reference signal 76 and a phase lock feedback signal 78 (a feedback of the phase lock oscillator output signal 86) to determine the phase error ($ERR_{FB\text{-}REF} = |ERR_{FB} - ERR_{REF}|$) between them and generates a phase lock phase error signal 80 which is proportional to the phase error. This phase lock phase error signal 80 is then used by a charge pump 4 to generate a phase lock oscillator tuning signal 82 which passes through a phase lock loop filter 6 to produce a phase lock oscillator tuning signal 82. The phase lock loop filter 6 is a low pass filter (typically 150 KHz) configured to slow changes in the phase lock oscillator tuning signal 82. The phase lock oscillator tuning signal 82 is sent to the phase lock oscillator 10. The phase lock oscillator 10 is a voltage controlled oscillator (VCO) that generates a phase lock oscillator output signal 86 with a frequency ($F_{VCO}$) that is controlled by the voltage of the phase lock oscillator tuning signal 82. The phase lock oscillator output signal 86 is split, one portion is output for external use and one portion fed back to the phase frequency detector 2 as the phase lock feedback signal 78. As used herein, to "divide" a signal means to divide the frequency of the signal and to "split" a signal means to split the signal into multiple signal paths, each with a substantially similar voltage waveform.

Optionally, a phase lock feedback divider 8 may divide the frequency ($F_{VCO}$) of the phase lock oscillator output signal 86 by a feedback divisor $N_{FB\text{-}1}$ so the frequency ($F_{FB}$) of the phase lock feedback signal 78 is $1/N_{FB\text{-}1}$ of the frequency ($F_{VCO}$) of the phase lock oscillator output signal 86. The feeding back of the phase lock oscillator output signal 86 into the phase frequency detector 2 produces a negative feedback loop. If the phase of the phase lock reference signal 76 changes relative to the phase of the phase lock feedback signal 78, the phase lock phase error signal 80 will change, driving the phase lock oscillator 10 to change frequency in the opposite direction, which will reduce the phase error ($ERR_{FB\text{-}REF}$). The result is the phase of the phase lock oscillator output signal 86 is locked to the phase of the phase lock reference signal 76 and the frequency ($F_{VCO}$) of the phase lock oscillator output signal 86 is locked to $N_{FB\text{-}1}$ times the frequency ($F_{REF}$) of the phase lock reference signal 76. For example, a phase lock reference signal 76 with a phase lock reference frequency ($F_{REF}$) of 100 MHz locking a phase lock oscillator output signal 86 with at frequency ($F_{VCO}$) of 6.4 GHz would have a feedback divisor $N_{FB\text{-}1}$ equal to 64.

The phase lock feedback divider 8 may be an integer-N divider or a fractional-N divider. For integer-N dividers, $N_{FB\text{-}1}$ is an integer, but for fractional-N dividers, $N_{FB\text{-}1}$ may be an integer or a fraction. If the frequency ($F_{VCO}$) of the phase lock oscillator output signal 86 is controlled entirely by the phase lock feedback divider 8, then the frequency resolution of the phase lock oscillator output signal 86 of an integer-N phase lock is limited to integer multiples of the frequency ($F_{REF}$) of the phase lock reference signal 76. A fractional-N divider allows the frequency resolution of the phase lock oscillator output signal 86 to be fractions of the frequency ($F_{REF}$) of the phase lock reference signal 76.

In designing a phase lock loop frequency synthesizer system, low phase noise is usually a primary objective. Phase noise may be introduced by the phase lock reference signal 76, generated by the phase lock oscillator 10, by the phase frequency detector 2, by the charge pump 4, and/or by the phase lock feedback divider 8. In most phase lock loop frequency synthesizer system designs, phase noise from the phase lock feedback divider 8 dominates over other sources of phase noise. In-band phase noise (inside the bandwidth of the phase lock loop filter 6) from the phase lock feedback divider 8 is proportional to $20 \log_{10}(N_{FB\text{-}1})$ while phase noise from the phase frequency detector 2 and charge pump 4 is proportional to $10 \log_{10}(F_{REF})$. Reducing the feedback divisor $N_{FB\text{-}1}$ by a factor of 2 will improve system phase noise by 6 dB. For example, doubling the frequency ($F_{REF}$) of the phase lock reference signal 76 raises phase noise from the phase frequency detector 2 and charge pump 4, but the allows the feedback divisor N to be halved, resulting in a net reduction of phase noise of $20 \log_{10}(½) + 10 \log_{10}(2) = -3$ dB. Thus, one way to minimize phase noise is to keep the phase lock reference frequency ($F_{REF}$) near the maximum for which the phase frequency detector 2 is designed so that feedback divisor $N_{FB\text{-}1}$ can be kept as low as possible. However, this will mean that the frequency of the phase lock oscillator output signal 86 can only increment in large steps as it is an integer multiple of the phase lock reference frequency ($F_{REF}$).

Another major consideration of a phase lock loop frequency synthesizer system is to minimize spurious signal components (spurs), particularly spurs with a frequency near the frequency ($F_{VCO}$) of the phase lock oscillator output signal 86 since they are difficult to filter out. Spurs can come from many sources, including being brought in on the phase lock reference signal 76, but the major source of spurs in the phase lock oscillator output signal 86 are divider spurs and reference spurs. Reference spurs are not the same as spurs brought in on the phase lock reference signal 76. Reference spurs are mainly generated by mismatches and leakage in the charge pump 4. Reference spurs occur at the phase lock reference frequency ($F_{REF}$) and harmonics thereof. Divider spurs are generated by variation in the modulus of a divider in the circuit, such as the phase lock feedback divider 8. For integer-N dividers, this variation in modulus is inadvertent and infrequent. For Fractional-N dividers, the modulus of the phase lock feedback divider 8 is changed deliberately and frequently, which leads to stronger spurs known as fractional spurs.

The bandwidth of the phase lock loop filter 6 ("the loop bandwidth") is a key design parameter of a phase lock loop frequency synthesizer system. The wider the loop bandwidth, the faster the lock time when changing the frequency ($F_{VCO}$) of the phase lock oscillator output signal 86. The trade-off is that a wider loop bandwidth will increase the integrated phase noise and potentially allow more spurs through. Furthermore, widening the loop bandwidth significantly (more than ⅕ of the phase lock reference frequency ($F_{REF}$)) may cause the loop to become unstable and permanently lose lock. Also, more spurs will likely occur within a wider loop bandwidth and not be attenuated or filtered out. Thus, the goal of minimizing phase noise and spurs pushes towards a narrower loop bandwidth.

A translation feedback loop frequency synthesizer 26 as shown in FIG. 2 is one way to minimize phase noise and spurs. The translation feedback loop frequency synthesizer 26 is similar to the phase lock loop circuit 1 shown in FIG. 1, but has a translation feedback loop 40 to convert (translate) the frequency ($F_{VCO}$) of the phase lock oscillator output signal 86 to a lower frequency. The translation feedback loop 40 has a translation feedback loop mixer 22, a translation feedback loop oscillator 24 and a translation feedback loop filter 20. The translation feedback loop oscillator 24 generates a translation feedback frequency signal 28. The translation feedback loop mixer 22 receives the phase lock oscillator output signal 86 (at frequency ($F_{VCO}$)) and mixes it with the translation feedback frequency signal 28 (at a frequency ($F_{itr}$)) to produce a translated phase lock oscillator output signal 30 that has a difference frequency and a summation frequency. The translated phase lock oscillator output signal 30 is filtered by a translation feedback loop filter 20, a low pass filter that filters out (attenuates) higher frequency summation mixing products and higher frequency spurs, allowing the difference product to pass through to the phase lock feedback divider 8. The phase lock feedback divider 8 divides the translated phase lock oscillator output signal 30 by the feedback divisor $N_{FB-2}$ to produce the phase lock feedback signal 78. The feedback divisor $N_{FB-2}$ can be set to a lower value or even to $N_{FB-2}=1$ because the translated phase lock oscillator output signal 30 has a lower frequency than the frequency ($F_{VCO}$) of the phase lock oscillator output signal 86. In designs that only need feedback divisor $N_{FB-2}$ to be 1, the phase lock feedback divider 8 may be eliminated and the output of the translation feedback loop filter 20 is the phase lock feedback signal 78. The net effect is that the phase lock oscillator output signal 86 will lock on to a frequency ($F_{VCO}$) that is $N_{FB-2}$ times the difference of the frequency ($F_{Tr}$) of the translation feedback frequency signal 28 and the frequency ($F_{Ref}$) of the phase lock reference signal 76. An integer-N phase lock loop is generally required when using a translation feedback loop. A fractional-N phase lock loop relies on noise shaping techniques, which requires a narrower loop bandwidth than can typically be used in a translation feedback loop.

For example, if the translation feedback loop frequency synthesizer 26 of FIG. 2 has a phase lock oscillator 10 capable of generating a phase lock oscillator output signal 86 ($F_{VCO}$) of 5 GHZ to 5.4 GHz, a translation feedback loop oscillator 24 capable of generating a translation feedback frequency signal 28 ($F_{Tr}$) of 4.9 GHz to 5.3 GHZ, a feedback divisor of $N_{FB-2}=1$, and a phase lock reference signal 76 frequency ($F_{Ref}$) of 100 MHz, then if the translation feedback loop oscillator 24 is set for generating a translation feedback frequency ($F_{Tr}$) of 4.9 GHZ, the phase lock oscillator output signal 86 will lock onto an oscillator output frequency ($F_{VCO}$) of 5 GHz. If the translation feedback loop oscillator 24 is set for generating a translation feedback frequency ($F_{Tr}$) of 5.3 GHZ, the phase lock oscillator output signal 86 will lock onto an oscillator output frequency ($F_{VCO}$) of 5.4 GHz.

Comparing this translation feedback loop frequency synthesizer 26 generating a phase lock oscillator output signal 86 at 5000 MHz to the traditional phase lock loop circuit 1 (see FIG. 1). To generate a phase lock oscillator output signal 86 at 5000 MHz the phase lock loop circuit 1 with a phase lock reference signal 76 of 100 MHz requires a phase lock feedback divider 8 divisor of $N_{FB-2}=50$. To generate a phase lock oscillator output signal 86 at 5000 MHz the translation feedback loop frequency synthesizer 26 with a phase lock reference signal 76 of 100 MHz and a translation feedback frequency signal 28 ($F_{Tr}$) of 4.9 GHz requires a phase lock feedback divider 8 divisor of N=1. This results in a net decrease in phase noise of −34 dB which is very significant (20 $\log_{10}$(⅟50)+10 $\log_{10}$(100/100)=−34 dB).

While the translation feedback loop frequency synthesizer 26 greatly reduces phase noise, it has some drawbacks. The frequency tuning range of the translation feedback loop oscillator must be at least as wide as the frequency tuning range of phase lock oscillator 10 or else the translation feedback loop frequency synthesizer 26 may not lock and become unstable.

What is needed is a phase lock loop frequency synthesizer that it can produce a phase lock voltage controlled oscillator output signal with sub-Hz frequency steps over a full octave virtually free of spurs and with greatly reduced phase noise compared to traditional phase lock loop frequency synthesizers.

BRIEF DESCRIPTION OF THE DRAWINGS

The accompanying drawings, which are incorporated into and constitute a part of this specification, illustrate one or more embodiments of the inventive subject matter and, together with the detailed description, serve to explain the principles and implementations thereof. Like reference numbers and characters are used to designate identical, corresponding, or similar components in different figures. The figures associated with this disclosure typically are not drawn with dimensional accuracy to scale, i.e., such drawings have been drafted with a focus on clarity of viewing and understanding rather than dimensional accuracy.

DETAILED DESCRIPTION

In describing the one or more representative embodiments of the inventive subject matter, use of directional terms such as "upper," "lower," "above," "below", "in front of," "behind," etc., unless otherwise stated, are intended to describe the positions and/or orientations of various components relative to one another as shown in the various Figures and are not intended to impose limitations on any position and/or orientation of any component relative to any reference point external to the Figures.

In the interest of clarity, not all of the routine features of representative embodiments of the inventive subject matter described herein are shown and described. It will, of course, be appreciated that in the development of any such actual implementation, numerous implementation-specific decisions must be made in order to achieve specific goals, such as compliance with application and business related constraints, and that these specific goals will vary from one implementation to another and from one developer to another. Those skilled in the art will recognize that numerous modifications and changes may be made to the representative embodiment(s) without departing from the scope of the claims. It will, of course, be understood that modifications of the representative embodiments will be apparent to those skilled in the art, some being apparent only after study, others being matters of routine mechanical, chemical and electronic design. No single feature, function or property of the representative embodiments is essential. In addition to the embodiments described, other embodiments of the inventive subject matter are possible, their specific designs depending upon the particular application. Any embodiment described as "comprising" includes the case of "consisting only of." The scope of the inventive subject matter should not be limited by the particular embodiments herein described but should be defined only by the appended claims and equivalents thereof.

First Representative Embodiment—Structure

Figure 1:
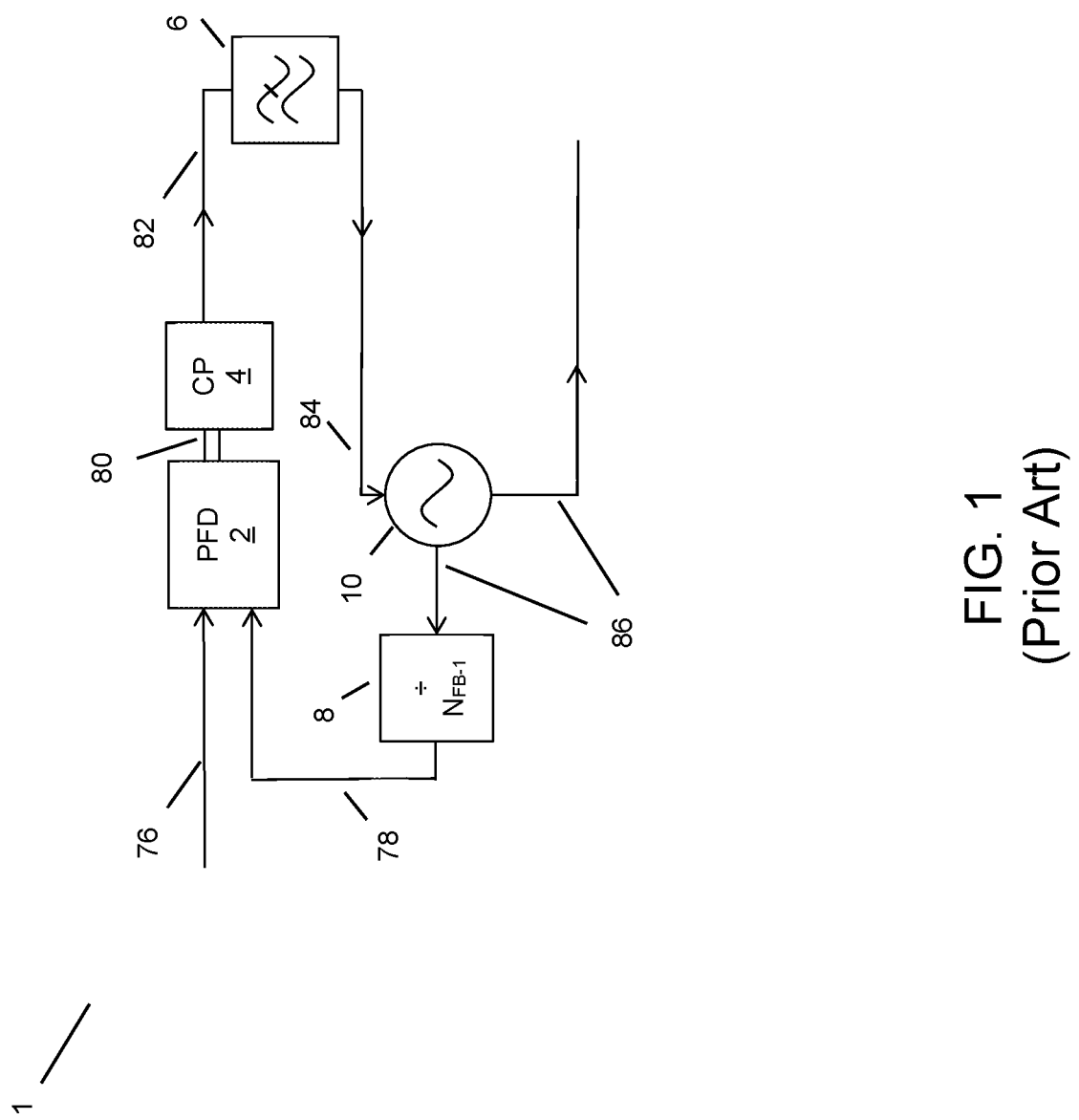
FIG. 1 is a schematic of a traditional (prior art) phase lock loop circuit 1.
Figure 2:
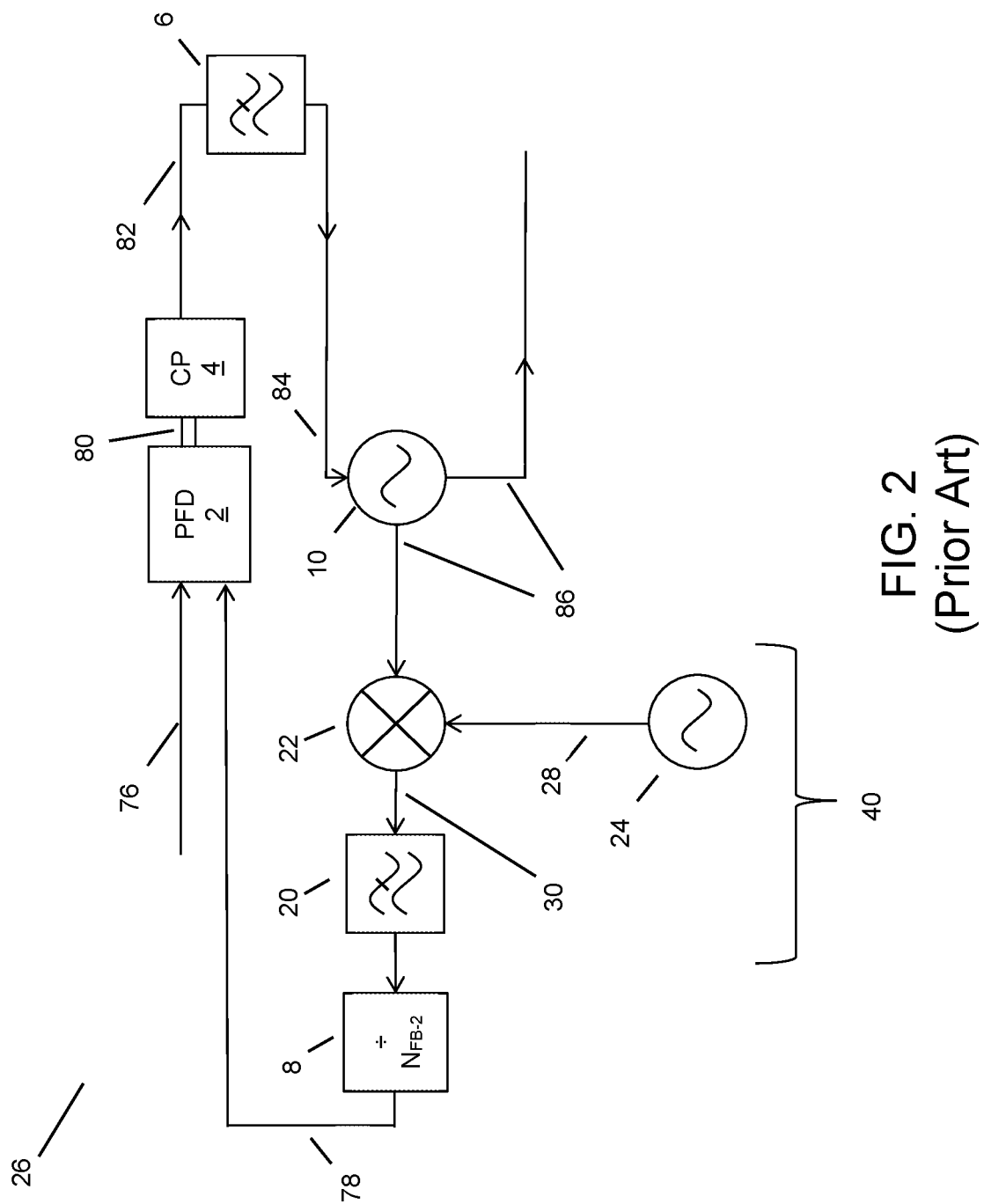
FIG. 2 is a schematic of a traditional (prior art) translation feedback loop frequency synthesizer 26.
Figure 3:
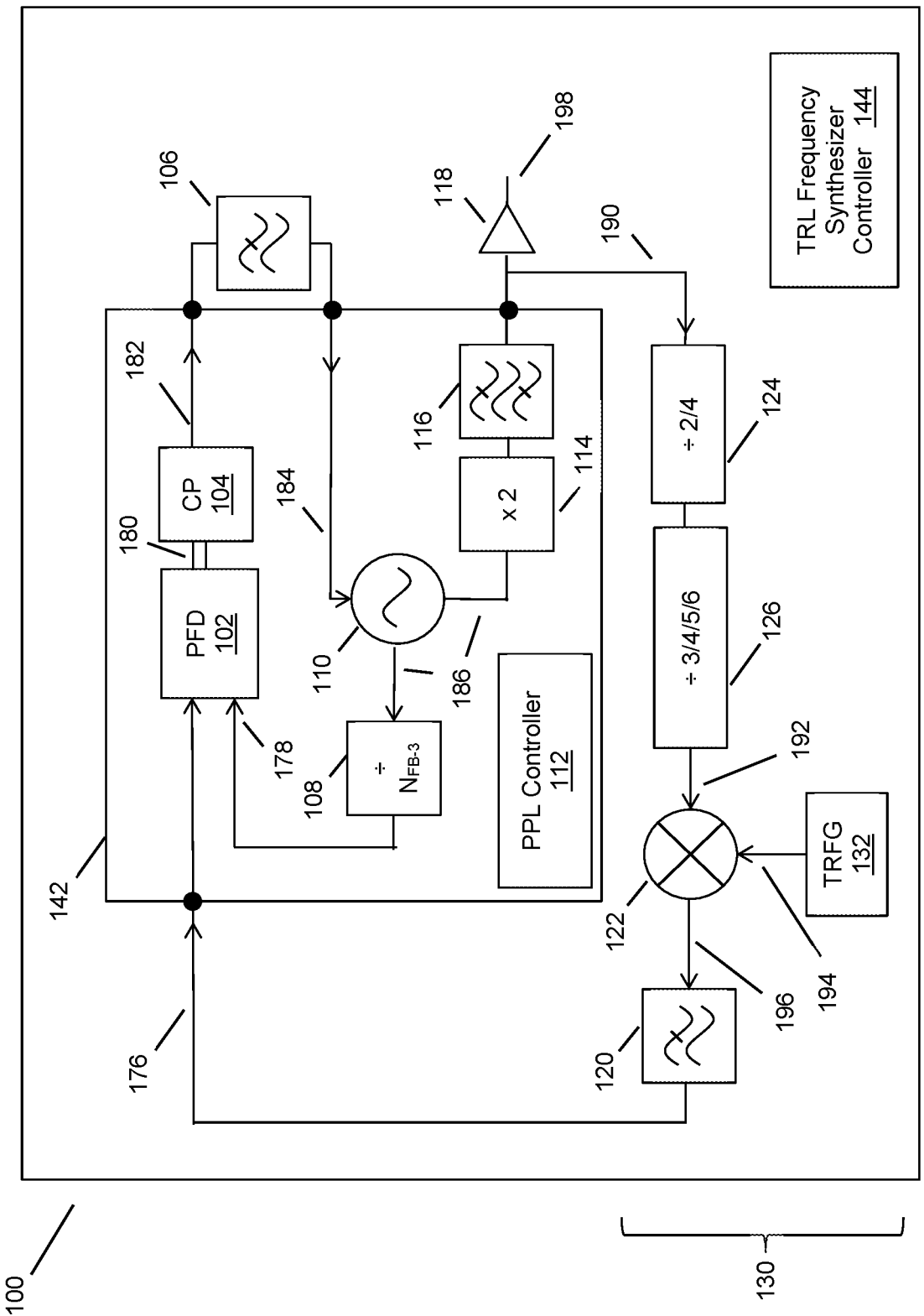
FIG. 3 is s schematic of a first embodiment translation reference loop frequency synthesizer 100.

FIG. 3 shows a first embodiment translation reference loop frequency synthesizer 100. The first embodiment translation reference loop frequency synthesizer 100 basic phase lock loop circuit components including a phase frequency detector 102 (PFD), a charge pump 104 (CP), a phase lock loop filter 106, a phase lock (voltage controlled) oscillator 110, and a phase lock feedback divider 108. In the first embodiment translation reference loop frequency synthesizer 100 these basic components, except for the phase lock loop filter 106, are all packaged in a phase lock loop integrated circuit 142, along with a phase lock oscillator output doubler 114, a phase lock oscillator output filter 116 and a phase lock loop controller 112. Specifically, in the first embodiment the phase lock loop integrated circuit 142 is the Analog Devices ADF4372, but other suitable integrated circuits may be used. However, in other embodiments these basic components are not packaged together in a single integrated circuit, but may each be discrete components or have some other packaging arrangement. The first embodiment translation reference loop frequency synthesizer 100 also has a translation reference loop 130 to provide a phase lock reference signal 176 based on a phase lock oscillator output signal 186 from the phase lock oscillator 110. Unlike the phase lock reference signal 76 in the traditional translation feedback loop frequency synthesizer 26, the phase lock reference signal 176 is not clean, but preserves the instantaneous phase error ($ERR_{Ref}$) from the (minimally divided) phase lock oscillator 110. The instantaneous phase error ($ERR_{Ref}$) in the phase lock reference signal 176 is the primary source of instantaneous phase error phase error to the phase frequency detector 102, with the instantaneous phase error ($ERR_{FB}$) in the phase lock feedback signal 178 a more minor source of phase error.

The phase frequency detector 102 is configured for comparing the phase lock reference signal 176 (with a phase lock reference frequency ($F_{Ref}$)) and a phase lock feedback signal 178 (with a feedback frequency ($F_{FB}$)) and determining the phase frequency error ($ERR_{FB-Ref}$) between them. The phase frequency detector 102 together with the charge pump 104 are configured for generating a phase lock phase error signal 180 which is proportional to the phase error ($ERR_{FB-Ref}$). In the first embodiment 100, the charge pump 104 is configured for selectable charge pump polarity and current. The phase lock loop filter 106 is a low pass filter configured for receiving the phase lock phase error signal 180 and producing a phase lock oscillator tuning signal 184 by filtering out higher frequency components from the phase lock phase error signal 180. In the first embodiment, the phase lock loop filter 106 has a passband of 0-400 KHz. Most of the phase noise and spurs generated from various sources are substantially attenuated by the phase lock loop filter 106. In particular, the phase noise and spurs generated by the phase frequency detector 102 and charge pump 104 are eliminated or heavily attenuated.

The phase lock oscillator 110 is a voltage controlled oscillator (VCO) configured to configured to receive the phase lock oscillator tuning signal 184 and for generating a phase lock oscillator output signal 186 with a phase lock oscillator output frequency ($F_{VCO}$) based on the voltage of the phase lock oscillator tuning signal 184. The phase lock oscillator 110 has a frequency output range that covers a full octave in frequency steps of less than 1 Hz and has multiple narrow tuning bands. In the first embodiment, the phase lock oscillator 110 has a frequency output range of 4-8 GHz using 4 cores and 256 bands per core, with each tuning band narrow enough such that the phase lock oscillator 110 does not lose lock and become unstable. In the first embodiment 100, each band of the phase lock oscillator 110 must be configured with a narrow enough tuning range so that the phase lock oscillator output signal 186 frequency ($F_{VCO}$) for any phase lock oscillator tuning signal 184 stays within +/−7.4% of the desired center frequency of the phase lock oscillator output signal 186. The phase lock oscillator 110 is configured to split the phase lock oscillator output signal 186 with one portion fed back through the phase lock feedback divider 108 to the phase frequency detector 102 as a phase lock feedback signal 178. As used herein to "divide" a signal means to divide the frequency of the signal and to "split" a signal means to split the signal into multiple signal paths, each with the same or a substantially similar voltage waveform. In alternative embodiments, this split is not performed by the phase lock oscillator 110, but by separate components downstream of the phase lock oscillator 110.

The phase lock feedback divider 108 is configured to divide the phase lock oscillator output frequency ($F_{VCO}$) by a feedback divisor $N_{FB-3}$ such that the feedback frequency ($F_{FB}$) is $1/N_{FB-3}$ of the phase lock oscillator output frequency ($F_{VCO}$). The feeding back of the phase lock feedback signal 178 into the phase frequency detector 102 produces a negative feedback loop to control the frequency ($F_{VCO}$) of the phase lock oscillator output signal 186. If the phase error ($ERR_{FB-Ref}$) between the phase lock feedback signal 178 and the phase lock reference signal 176 is not zero, then the phase lock phase error signal 180 will change, causing the phase lock oscillator 110 to change frequency ($F_{VCO}$) so as to reduce the phase error ($ERR_{FB-Ref}$). This mismatch typically occurs either because the phase lock oscillator output signal 186 frequency ($F_{VCO}$) has drifted or because the phase lock reference signal 176 frequency ($F_{Ref}$) has changed, or because the feedback divisor $N_{FB-3}$ of the phase lock feedback divider 108 has been changed. The phase lock oscillator output signal 186 frequency ($F_{VCO}$) changes until it stabilizes at $N_{FB-3}$ times phase lock feedback signal 178 frequency ($F_{FB}$) with the phase error ($ERR_{FB-Ref}$) at zero.

While one portion of the phase lock oscillator output signal 186 is sent to the phase lock feedback divider 108, another portion is sent to the phase lock oscillator output doubler 114 and subsequently to the phase lock oscillator output filter 116, which are configured to respectively double the frequency of the phase lock oscillator output signal 186 and filter the phase lock oscillator output signal 186 to produce a translation reference loop input signal 190 ($F_{TRef}$). The translation reference loop input signal 190 is split and one portion is sent to the translation reference loop 130 and the other through a phase lock output amplifier 118 to become the frequency synthesizer output signal 198. In some alternative embodiments, the frequency synthesizer output signal 198 follows a parallel path from the phase lock oscillator 110 through a second phase lock oscillator output doubler, a second phase lock oscillator output filter, and then through the phase lock output amplifier 118. In some alternative embodiments, the phase lock oscillator output doubler 114 and/or the phase lock oscillator output filter 116 are omitted and the phase lock oscillator output signal 186 passes directly to the translation reference loop 130 as the translation reference loop input signal 190.

The purpose of the translation reference loop 130 (also known as an offset loop) is to provide a reference signal to the phase frequency detector 102 while reducing phase noise in the phase lock oscillator output signal 186. The translation reference loop 130 comprises one or more translation loop dividers (124, 126), a translation reference loop mixer 122, a translation reference frequency generator 132, and a translation reference loop filter 120. The one or more translation loop dividers are configured for generating a translation reference loop divided signal 192 by dividing the translation reference loop input signal 190 by a translation loop divisor. In the first embodiment translation reference loop frequency synthesizer 100, the translation reference loop 130 has two translation loop dividers (a first translation loop divider 124, and a second translation loop divider 126) in series, but in other embodiments, the translation reference loop 130 may have only one translation loop divider. In yet other embodiments, the translation reference loop 130 may have more than two translation loop dividers in series. Each of the one or more translation loop dividers are configured to have a translation loop divisor that can be set to one of an array of integer values. Together, the one or more translation loop dividers are configured so that their divisor values ($N_{T1}$, $N_{T2}$ ... ) can be set (typically by the translation reference loop frequency synthesizer controller 144) such that together they have a translation loop divisor ($N_{TL}$). In the first embodiment translation reference loop frequency synthesizer 100, the first translation loop divider 124 has a first translation divisor ($N_{T1}$) that can be set to either 2 or 4 and the second translation loop divider 126 has a second translation divisor ($N_{T2}$) that can be set to either 3, 4, 5, or 6. The one or more translation loop dividers (124, 126) are set such that the translation loop divisor ($N_{TL}$) is sufficient to bring the translation reference loop divided signal 192 frequency ($F_{DRef}$) into an effective translation frequency range that is less than an allowable frequency range. The allowable translation frequency range is the maximum translation frequency range that will not result in the phase lock reference signal 176 frequency ($F_{Ref}$) exceeding the maximum allowed by the phase frequency detector 102. The allowable translation frequency range should be a frequency range where surface acoustic wave filters are effective—less than 2.5 GHz. The allowable translation frequency range has a center frequency that is the same as the translation reference oscillator signal 134 frequency ($F_{Tosc}$) and a frequency half width that is at least the sum of the maximum direct digital synthesizer signal 136 frequency ($F_{DDS}$) and the maximum allowed phase lock reference signal 176 frequency ($F_{Ref}$). In the first embodiment 100, the translation reference oscillator signal 134 frequency $F_{Tosc}$=1 GHz, the maximum direct digital synthesizer signal 136 frequency $F_{DDS}$=45 MHz and the maximum allowed phase lock reference signal 176 frequency $F_{Ref}$=120 MHz, so the half width of the allowable translation frequency range is 165 MHz and the allowable translation frequency range is 835-1165 MHz. In the first embodiment 100, the widest effective translation frequency range occurs at a boundary between $N_{T2}$=3 and $N_{T2}$=4 with $N_{T1}$=2 and phase lock oscillator output signal 186 frequency $F_{VCO}$=6857 MHz. With $N_{T2}$=3 the translation reference loop divided signal 192 frequency $F_{DRef}$=1143 MHz. With $N_{T2}$=4 the translation reference loop divided signal 192 frequency $F_{DRef}$=857 MHz. Thus, for the first embodiment translation reference loop frequency synthesizer 100, the effective translation frequency range is 857-1143 MHz.

For example, to divide a translation reference loop input signal 190 with a frequency of 8.16 GHz down into the translation frequency range of 850-1150 MHz, the first translation loop divider 124 can be set by the translation reference loop frequency synthesizer controller 144 to have a value of 2 and the second translation loop divider 126 can be set to a value of 4, which results in a frequency of 1.02 GHz. To divide a translation reference loop input signal 190 with a frequency of 6.5 GHz down into the translation frequency range of 850-1150 MHz, the first translation loop divider 124 can be set by the translation reference loop frequency synthesizer controller 144 to have a value of 2 and the second translation loop divider 126 can be set to a value of 3, which results in a frequency of 1.08 GHz.

The translation reference loop mixer 122 is configured for generating a translated phase lock oscillator output signal 196 by mixing the translation reference loop divided signal 192 and a translation reference frequency signal 194 from the translation reference frequency generator 132. The translation reference loop filter 120 generates the phase lock reference signal 176 by taking in the translation reference mixed signal 196 and filtering out higher frequency components.

The translation reference loop filter 120 is a standard LC lowpass since a surface acoustic wave filter would introduce undesirable amounts of delay. Surface acoustic wave (SAW) filters have unique properties that enable narrow passband widths at frequencies up to around 2.5 GHZ, but typically have tens or hundreds of nanoseconds of delay. In the first embodiment, the translation reference loop filter 120 has a passband of 0 to 125 MHz.

Figure 4:
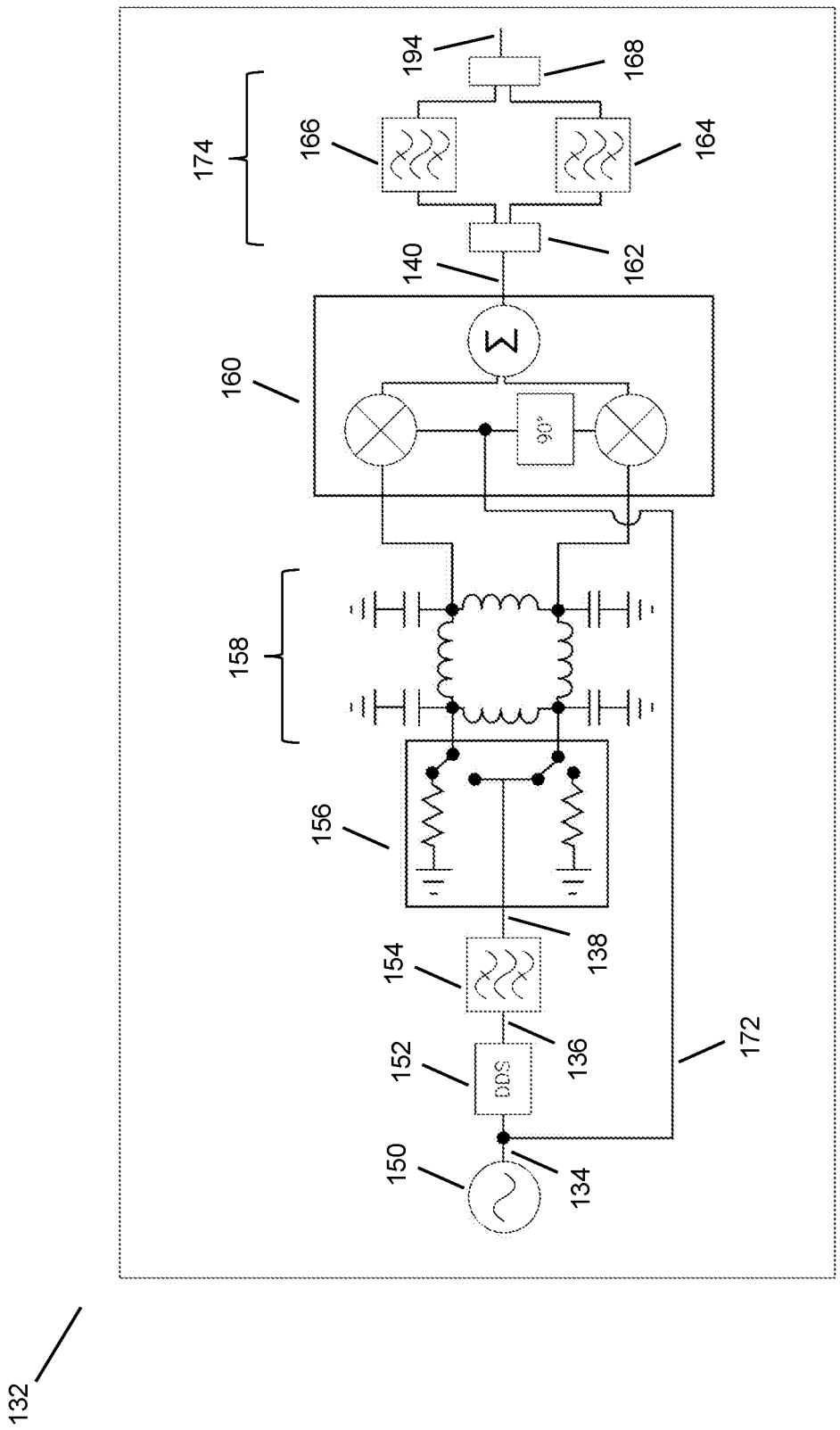
FIG. 4 shows a schematic of the translation reference frequency generator 132.

FIG. 4 shows a schematic of the translation reference frequency generator 132. The translation reference frequency generator 132 is configured for generating a translation reference signal 194 that is very clean (free of phase noise, spurs). The translation reference frequency generator 132 has a translation reference oscillator 150, a direct digital synthesizer 152, a direct digital synthesizer filter 154, an absorptive switch 156, a quadrature splitter 158, a quadrature modulator 160, and a translation reference filter bank 174.

The translation reference oscillator 150 is configured to generate a translation reference oscillator signal 134 that is very clean (low phase noise, low spurs) at a frequency ($F_{Tosc}$) that is fixed. In the first embodiment 100, the translation reference oscillator 150 generates a translation reference oscillator signal 134 at a frequency ($F_{Tosc}$) of 1 GHz, but in alternative embodiments, the translation reference oscillator 150 may generate a different fixed frequency. In the first embodiment 100, the translation reference oscillator 150 is a 100 MHz OCXO followed by a frequency doubler, and then a ×5 multiplier and SAW filters, but in other embodiments, other suitable oscillators may be used.

The direct digital synthesizer 152 uses the translation reference oscillator signal 134 to generate a direct digital synthesizer signal 136. The direct digital synthesizer 152 has a tuning word register that allows tuning of the direct digital synthesizer signal 136 over a direct digital synthesizer signal 136 frequency range. Changing the value of the tuning word register changes the direct digital synthesizer signal 136 frequency ($F_{DDS}$). In the first embodiment 100, the translation reference loop frequency synthesizer controller 144 sets the value of the tuning word registry. In the first embodiment 100, the tuning word register of the direct digital synthesizer 152 is a 48 bit tuning word and is configured for tuning over a direct digital synthesizer signal 136 frequency tuning range of 37.7-45 MHz (5 MHz bandwidth with a center frequency of 42.5 MHz) with ~17 µHz resolution, but other embodiments may have other tuning range and tuning values. As the direct digital synthesizer signal 136 frequency ($F_{DDS}$) increases, both the phase noise and the energy in spurious frequencies (spurs) increase, neither of which are desirable. However, when the direct digital synthesizer signal 136 frequency ($F_{DDS}$) is below about 1/16 the translation reference oscillator signal 134 frequency ($F_{Tosc}$), non-harmonic spurious energy is virtually undetectable. This is important because in-band spurs on that are passed into the phase lock reference signal 176 tend to be higher in the phase lock oscillator output signal 186 by a factor of 20 $\log10(F_{VCO}/F_{Ref})$.

The direct digital synthesizer filter 154 filters the direct digital synthesizer signal 136 to produce a filtered direct digital synthesizer signal 138. The filtered direct digital synthesizer signal 138 is passed through the absorptive switch 156 and the quadrature splitter 158. The quadrature splitter 158 splits the filtered direct digital synthesizer signal 138 into quadrature components and the absorptive switch 156 determines which quadrature component leads and which lags. The absorptive switch 156 is controlled by the translation reference loop frequency synthesizer controller 144. The quadrature splitter 158 is designed for the same frequency band as the tuning range of the direct digital synthesizer 152. In the first embodiment 100, the quadrature splitter 158 is designed for a center frequency of 42.5 MHz, but have different values in other embodiments.

The quadrature modulator 160 is configured to generate a quadrature modulator signal 140 taking a feedforward 172 of the translation reference oscillator signal 134 and mixing with the quadrature components of the filtered direct digital synthesizer signal 138. The quadrature modulator signal 140 has a frequency ($F_{QM}$) that is the sum or the difference of the frequencies of the translation reference oscillator signal 134 and the direct digital synthesizer signal 136. Whether the quadrature modulator signal 140 has a frequency ($F_{QM}$) that is the sum or the difference depends on the position of the absorptive switch 156, selecting one mixing product and cancelling the mirror image product. In the first embodiment, the quadrature modulator signal 140 has a frequency of 1 GHz mixed up or down by the direct digital synthesizer signal 136 frequency ($F_{DDS}$). With a quadrature modulator signal 140 tuned for the expected range of translation reference oscillator signal 134 and the expected range of filtered direct digital synthesizer signal 138, a phase noise floor at or below −150 dBc/Hz may be maintained.

The translation reference filter bank 174 is configured to generate the translation reference frequency signal 194 by filtering the quadrature modulator signal 140. The translation reference filter bank 174 has a first translation reference bandpass filter 164 and a second translation reference bandpass filter 166, a translation reference signal splitter 162 and a translation reference signal coupler 168. The quadrature modulator signal 140 is split by the translation reference signal splitter 162 and passes to both the first translation reference bandpass filter 164 and the second translation reference bandpass filter 166, then the translation reference signal coupler 168 recombines to the translation reference frequency signal 194. The first translation reference bandpass filter 164 and second translation reference bandpass filter 166 are surface acoustic wave (SAW) filters. The first translation reference bandpass filter 164 has a passband center that is the same as the sum of the center frequencies of the translation reference oscillator signal 134 and the direct digital synthesizer signal 136 tuning range. The second translation reference bandpass filter 166 has a passband center that is same as the difference of the center frequencies of the translation reference oscillator signal 134 and the direct digital synthesizer signal 136 tuning range. The bandwidths of the first translation reference bandpass filter 164 and second translation reference bandpass filter 166 are at least equal to the direct digital synthesizer signal 136 frequency range, but in some embodiments may be wider. The translation reference filter bank 174 removes or highly attenuates any feed-through of the translation reference oscillator signal 134, any image, and any nonlinear mixing products, al of which are not harmonically related to the frequencies used in the translation reference loop 130 and would therefore cause spurs. In the first embodiment 100, the translation reference filter bank 174 has 4 SAW filters to reduce spurs by ~100 dB.

The phase lock reference signal 176, the translation reference loop divided signal 192, and the translation reference frequency signal 194 are always harmonically related, even for sub-Hz frequency steps in the phase lock oscillator output signal 186 frequency ($F_{VCO}$). In most operational states of the first embodiment translation reference loop frequency synthesizer 100, system parameters can be set such that both the translation reference loop divided signal 192 frequency ($F_{DRef}$) and the translation reference frequency signal 194 frequency ($F_{TRef}$) are exact multiples of the phase lock reference signal 176 frequency ($F_{Ref}$), putting the spur closest to the phase lock oscillator output signal 186 frequency ($F_{VCO}$) a spectral distance away at least equal to the minimum direct digital synthesizer signal 136 frequency ($F_{DDS}$). The phase lock loop filter 106 can attenuate any such spur by over 60 dB. Where this is not possible, system parameters can set so the translation reference loop divided signal 192 frequency ($F_{DRef}$), and the translation reference frequency signal 194 frequency ($F_{TRef}$) will be exact multiples of the phase lock reference signal 176 frequency ($F_{Ref}$) divided by 2, 3, or 5 and selected to keep spurs at least 20 MHz away from the phase lock oscillator output signal 186 frequency ($F_{VCO}$) so that the phase lock loop filter 106 will attenuate them by about 50 dB.

First Representative Embodiment—Operations

The first embodiment translation reference loop frequency synthesizer 100 has improved phase noise over the traditional phase lock loop circuit 1 because the effective "N divider" for phase noise purposes moves from the phase lock feedback divider 8 inside the basic phase lock loop feedback to the one or more translation loop dividers (124, 126) in the translation reference loop 130. This is because the phase frequency detector 102 has limited sensitivity to detect the phase difference (PD) between the phase lock feedback signal 178 and the phase lock reference signal 176 over any phase noise (PN) present in these signals and internal to the phase frequency detector 102. The phase difference (PD) signal-to-noise ratio is the ratio of the phase difference (PD) to the phase noise (PN) seen by the phase frequency detector 102 determines the amount phase noise the phase frequency detector 102 puts out. The phase lock reference signal 176 is noisier than the phase lock feedback signal 178. The phase noise (PN) the phase lock reference signal 176 and the phase noise (PN) in the phase lock feedback signal 178 are from the same source (the phase lock oscillator 110) and therefore coherent but scaled differently, so the noise from the phase lock feedback divider 108 either slightly adds or slightly subtracts from the effective phase difference (PD) seen at the phase frequency detector 102.

In the traditional phase lock loop circuit 1, the phase lock oscillator output signal 86 frequency ($F_{VCO}$) are divided in the phase lock feedback divider 8 by divisor $N_{FB-1}$ to produce the phase lock feedback signal 78. The instantaneous phase error ($ERR_{FB}$) on the phase lock feedback signal 78 is the instantaneous phase error ($ERR_{VCO}$) of the phase lock oscillator output signal 86 divided by the phase lock feedback divider 8 divisor $N_{FB-1}$. $ERR_{FB}=ERR_{VCO}/N_{FB-1}$. The instantaneous phase error ($ERR_{REF}$) on the phase lock reference signal 76 is $ERR_{REF}=0$ because phase error is defined as the phase difference relative to the phase of an idea reference). The phase lock feedback signal 78 is then compared in the phase frequency detector 2 to the phase lock reference signal 76—a "perfect" reference (without phase noise). The phase frequency detector 2 sees a phase difference (PD) of $|ERR_{FB}-ERR_{REF}|=|ERR_{VCO}/N_{FB-1}|$. For example, for the traditional phase lock loop circuit 1 to generate to generate a phase lock oscillator output signal 86 at 4.08 GHz with a phase lock reference signal 176 at frequency $F_{REF}=63.75$ MHz would require $N_{FB-1}=64$. The phase frequency detector 2 sees a phase difference equal to $|ERR_{VCO}/N_{FB-1}|=ERR_{VCO}/64$.

In the first embodiment translation reference loop frequency synthesizer 100, the translation reference loop 130 has two mechanisms for reducing frequency of the translation reference loop input signal 190—the translation loop dividers (124, 126) and the translation reference loop mixer 122. The translation loop dividers (124, 126) reduce the instantaneous phase error ($ERR_{VCO}$) of the phase lock oscillator output signal 186, but the translation reference loop mixer 122 does not. The instantaneous phase error ($ERR_{REF}$) on the phase lock reference signal 176 is the instantaneous phase error ($ERR_{VCO}$) of the phase lock oscillator output signal 186 doubled then divided by the first translation loop divider 124 divisor ($N_{T1}$) and the second translation loop divider 126 divisor ($N_{T2}$). $ERR_{REF}=(2)ERR_{VCO}/(N_{T1})(N_{T2})$. The instantaneous phase error ($ERR_{FB}$) on the phase lock feedback signal 178 is the instantaneous phase error ($ERR_{VCO}$) of the phase lock oscillator output signal 186 divided by the phase lock feedback divider 108 divisor $N_{FB-3}$. The phase frequency detector 102 sees the phase difference PD between the phase lock feedback signal 178 and the phase lock reference signal 176 equal to $|ERR_{FB}-ERR_{REF}|=|ERR_{VCO}/N_{FB-3}-(2)ERR_{VCO}/(N_{T1})(N_{T2})|$. This architecture reduces the effective N by a factor of 8 to 25, resulting in a phase noise floor that is 18 to 28 dB lower than with the phase lock loop circuit 1. The phase lock reference signal 176 frequency ($F_{Ref}$) must be above a minimum value to ensure the phase lock oscillator 110 cannot tune beyond the stable range of the translation reference loop 130. The maximum phase lock reference signal 176 frequency ($F_{Ref}$) must be low enough to accomplish the required PLL noise floor reduction, and must be below the maximum frequency of the phase frequency detector 102.

For example, to generate phase lock oscillator output signal 186 of 4.08 GHZ, the controller 144 sets the first translation loop divider 124 divisor value $N_{T1}$ to 2, the second translation loop divider 126 divisor value $N_{T2}$ to 4, the phase lock feedback divider 108 divisor value $N_{FB-3}$ to 64, the direct digital synthesizer signal 136 frequency ($F_{DDS}$) to 43.75 MHz, and the absorptive switch 156 set to select for the difference product of the quadrature modulator 160. The phase frequency detector 102 sees a phase difference equal to $|ERR_{VCO}/64-(2)ERR_{VCO}/(2)(4)|=|ERR_{VCO}(1/64-1/4)|=ERR_{VCO}(15/64)$. The signal-to-noise ratio of the first embodiment translation reference loop frequency synthesizer 100 is 15 times higher than for the traditional phase lock loop circuit 1, resulting in 23.5 dB better phase noise performance.

For a traditional phase lock loop circuit 1, if the phase error $ERR_{VCO}$ drifted positive by 1 degree, the instantaneous phase error ($ERR_{FB}$) would be 1/64 of a degree and the phase frequency detector 2 would see a 1/64 degree difference between the instantaneous phase error ($ERR_{FB}$) and the instantaneous phase error ($ERR_{REF}$). In the first embodiment translation reference loop frequency synthesizer 100 this same 1 degree drift would make the instantaneous phase error ($ERR_{REF}$) positive 1/4 degree, so the phase frequency detector 2 would see a net change of 17/64 degree, or a 17 times bigger change.

Being able to tune the translation reference frequency signal 194 over a sufficient range makes several possible combinations of phase lock feedback divider 108 divisor values ($N_{FB-3}$) and direct digital synthesizer signal 136 frequencies ($F_{DDS}$) to produce any given phase lock oscillator output signal 186 frequency ($F_{VCO}$). This is important because the direct digital synthesizer 152 can produce spurious frequencies, and if a one of these spurs occurs at a frequency close enough to the phase lock oscillator output signal 186 frequency ($F_{VCO}$) that it passes through the translation reference filter bank 174 and the phase lock loop filter 106, then different combinations of parameters can be selected for the direct digital synthesizer signal 136 frequency ($F_{DDS}$), and phase lock feedback divider 108 divisor ($N_{FB-3}$) to produce the same phase lock oscillator output signal 186 frequency ($F_{VCO}$) until a combination is found that does not generate problematic spurs. The first embodiment translation reference loop frequency synthesizer 100 is designed such that it can produce the same phase lock oscillator output signal 186 frequency ($F_{VCO}$) for at least 2 values for the phase lock feedback divider 108 divisor ($N_{FB-3}$). In the first embodiment translation reference loop frequency synthesizer 100, the translation reference loop frequency synthesizer controller 144 is configured to try a different combination of divisors if a spur is detected within the minimum direct digital synthesizer signal 136 frequency ($F_{DDS}$) of the phase lock oscillator output frequency ($F_{VCO}$), but in other embodiments other values may be used and may be user settable.

Table 1 shows values for a first operational configuration and a second operational configuration of the first embodiment translation reference loop frequency synthesizer 100. Both configurations cause the first embodiment translation reference loop frequency synthesizer 100 to produce a phase lock oscillator output signal 186 with a frequency of 4080 MHz.

TABLE 1

|  | First Config. | Second Config. |
|---|---|---|
| Phase lock oscillator output signal 186 frequency ($F_{VCO}$) (MHz) | 4080 | 4080 |
| Translation reference loop input signal 190 ($F_{TRef}$) (MHz). | 8160 | 8160 |
| First translation loop divider 124 divisor ($N_{T1}$) | 2 | 2 |
| Second translation loop divider 126 divisor ($N_{T2}$) | 4 | 4 |
| Translation reference loop divided signal 192 frequency ($F_{DRef}$) (MHz) | 1020 | 1020 |
| Phase lock feedback divider 108 value ($N_{FB-3}$) | 64 | 65 |
| Phase lock reference signal 176 frequency ($F_{Ref}$) (MHz) | 63.75 | 62.77 |
| Translation reference frequency signal 194 ($F_{TRef}$) (MHz) | 956.25 | 957.23 |
| Direct Digital Synthesizer signal 136 frequency ($F_{DDS}$)(MHz) | 43.75 | 42.769 |

In the first operation configuration, the controller 144 sets the direct digital synthesizer signal 136 frequency ($F_{DDS}$) to 43.75 MHz, the first translation loop divider 124 divisor value $N_{T1}$ to 2, the second translation loop divider 126 divisor value $N_{T2}$ to 4, the phase lock feedback divider 108 divisor value $N_{FB-3}$ to 64, and the absorptive switch 156 set to select for the difference product of the quadrature modulator 160.

Tracing the generation of the translation reference frequency signal 194, the direct digital synthesizer signal 136 at frequency $F_{DDS}$=43.75 MHz and the translation reference oscillator signal 134 at frequency $F_{Tosc}$=1 MHz are combined in the quadrature modulator 160 to generate the quadrature modulator signal 140 from the difference product at 956.25 MHz. The mirror image summation product at 1043.75 MHz is cancelled due to the position of the absorptive switch 156. The quadrature modulator signal 140 is filtered by the translation reference filter bank 174 to produce the translation reference frequency signal 194 at frequency $F_{TRef}$=956.25 MHz.

Tracing the generation of the phase lock reference signal 176, the phase lock oscillator output signal 186 at frequency $F_{VCO}$=at 4080 MHz is doubled to the translation reference loop input signal 190 at 8160 MHz then divided by the first translation loop divider 124 ($N_{T1}$=2) and the second translation loop divider 126 ($N_{T2}$=4) to produce a translation reference loop divided signal 192 at 1020 MHz. The translation reference loop divided signal 192 is mixed by the translation reference loop mixer 122 with the translation reference frequency signal 194 at frequency $F_{TRef}$=956.25 MHz from the translation reference frequency generator 132 to produce a difference product at 63.75 MHz and a mirror image summation product at 1,976.25 MHz. The translation reference loop filter 120 filters out the mirror image summation product to leave the phase lock reference signal 176 at frequency $F_{Ref}$=63.75 MHz.

Tracing the generation of the phase lock feedback signal 178, the phase lock oscillator output signal 186 at frequency $F_{VCO}$=4080 MHz is divided by phase lock feedback divider 108 divisor $N_{FB-3}$=64 to produce the phase lock feedback signal 178 at frequency $F_{FB}$=63.75 MHz. This matches the phase lock reference signal 176 frequency $F_{Ref}$ so the phase lock oscillator output signal 186 is stable at frequency $F_{VCO}$=4080 MHz. If the first configuration produces unwanted spurs near the phase lock oscillator output signal 186 frequency ($F_{VCO}$), then the translation reference loop frequency synthesizer controller 144 can switch to the second operational configuration.

In the second operation configuration, the controller 144 sets the direct digital synthesizer signal 136 ($F_{DDS}$) to 42.76923 MHz, the first translation loop divider 124 divisor value to 2, the second translation loop divider 126 divisor value to 4, the phase lock feedback divider 108 divisor value N to 65, and the absorptive switch 156 set to select for the difference product of the quadrature modulator 160. This still results in a phase lock oscillator output signal 186 of 4080 MHz, but with a slightly lower phase lock reference signal 176 frequency ($F_{Ref}$) and slightly higher divisor value N for the phase lock feedback divider 108.

The first operation configuration is cleaner than the second operational configuration because the translation reference frequency signal 194 frequency ($F_{TRef}$) divided by the phase lock reference signal 176 frequency ($F_{Ref}$) is an integer, so the nearest spur is 63.75 MHz (phase lock reference signal 176 frequency ($F_{Ref}$)) away from the phase lock oscillator output signal 186 frequency ($F_{VCO}$), which is easily removed by the PLL loop filter 106.

Table 2 shows values for a third and a fourth operational configurations of the first embodiment translation reference loop frequency synthesizer 100. Both configurations cause the first embodiment translation reference loop frequency synthesizer 100 to produce a phase lock oscillator output signal 186 with a frequency of 6500 MHz.

TABLE 2

|  | Third Config. | Fourth Config. |
|---|---|---|
| Phase lock oscillator output signal 186 frequency ($F_{VCO}$) (MHz) | 6500 | 6500 |
| Translation reference loop input signal 190 ($F_{TRef}$) (MHz). | 13000 | 13000 |
| First translation loop divider 124 divisor ($N_{T1}$) | 4 | 4 |
| Second translation loop divider 126 divisor ($N_{T2}$) | 3 | 3 |
| Translation reference loop divided signal 192 frequency ($F_{DRef}$) (MHz) | 1083.33 | 1083.33 |
| Phase lock feedback divider 108 value ($N_{NB-3}$) | 54 | 156 |
| Phase lock reference signal 176 frequency ($F_{Ref}$) (MHz) | 120.37 | 41.67 |
| Translation reference frequency signal 194 ($F_{TReF}$) (MHZ) | 962.96 | 1041.67 |
| Direct Digital Synthesizer signal 136 frequency ($F_{DDS}$)(MHz) | 37.037 | 41.667 |

In the third operation configuration, the controller 144 sets the direct digital synthesizer signal 136 ($F_{DDS}$) to 37.037 MHz, the first translation loop divider 124 divisor value $N_{T1}$ to 4, the second translation loop divider 126 divisor value $N_{T2}$ to 3, the phase lock feedback divider 108 divisor value $N_{NB-3}$ to 54, and the absorptive switch 156 set to select for the difference product of the quadrature modulator 160.

In the fourth operation configuration, the controller 144 sets the direct digital synthesizer signal 136 ($F_{DDS}$) to 41.667 MHZ, the first translation loop divider 124 divisor value $N_{T1}$ to 4, the second translation loop divider 126 divisor value $N_{T2}$ to 3, the phase lock feedback divider 108 divisor value N to 156, and the absorptive switch 156 set to select for the summation product of the quadrature modulator 160.

Table 3 shows values for a fifth and a sixth operational configurations of the first embodiment translation reference loop frequency synthesizer 100. Both configurations cause the first embodiment translation reference loop frequency synthesizer 100 to produce a phase lock oscillator output signal 186 with a frequency of 8000 MHz.

TABLE 3

|  | Fifth Config. | Sixth Config. |
|---|---|---|
| Phase lock oscillator output signal 186 frequency ($F_{VCO}$) (MHz) | 8000 | 8000 |
| Translation reference loop input signal 190 ($F_{TRef}$) (MHz). | 16000 | 16000 |
| First translation loop divider 124 divisor ($N_{T1}$) | 4 | 4 |
| Second translation loop divider 126 divisor ($N_{T2}$) | 4 | 4 |
| Translation reference loop divided signal 192 frequency ($F_{DRef}$) (MHz) | 1000 | 1000 |
| Phase lock feedback divider 108 value ($N_{NB-3}$) | 184 | 190 |
| Phase lock reference signal 176 frequency ($F_{Ref}$) (MHz) | 43.478 | 42.102 |
| Translation reference frequency signal 194 ($F_{TRF}$) (MHZ) | 956.52 | 957.89 |
| Direct Digital Synthesizer signal 136 frequency ($F_{DDS}$) (MHZ) | 43.478 | 42.105 |

In the fifth operation configuration, the controller 144 sets the direct digital synthesizer signal 136 ($F_{DDS}$) to 43.478 MHz, the first translation loop divider 124 divisor value $N_{T1}$ to 4, the second translation loop divider 126 divisor value $N_{T2}$ to 4, the phase lock feedback divider 108 divisor value $N_{NB-3}$ to 184, and the absorptive switch 156 set to select for the difference product of the quadrature modulator 160.

In the fourth operation configuration, the controller 144 sets the direct digital synthesizer signal 136 ($F_{DDS}$) to 42.105 MHz, the first translation loop divider 124 divisor value $N_{T1}$ to 4, the second translation loop divider 126 divisor value $N_{T2}$ to 4, the phase lock feedback divider 108 divisor value $N_{NB-3}$ to 190, and the absorptive switch 156 set to select for the difference product of the quadrature modulator 160.

What is claimed is:

1. A translation reference loop frequency synthesizer comprising:
   a phase lock loop circuit configured for generating a phase lock oscillator output signal based on a phase difference of a phase lock feedback signal and a phase lock reference signal; and
   a translation reference loop configured for generating the phase lock reference signal based on mixing a translation reference frequency signal and a translation reference loop divided signal.

2. The translation reference loop frequency synthesizer of claim 1, wherein the translation reference loop further comprises:
   a series of one or more translation loop dividers configured for generating the translation reference loop divided signal by dividing a frequency of the phase lock oscillator output signal by a translation loop divisor;
   a translation reference frequency generator configured for generating the translation reference frequency signal;
   a translation reference loop mixer configured for generating a translated phase lock oscillator output signal by mixing the translation reference loop divided signal and the translation reference frequency signal to produce a summation product and a difference product; and
   a translation reference loop filter configured for generating the phase lock reference signal by passing through the difference product of the translated phase lock oscillator output signal and filtering out the summation product.

3. The translation reference loop frequency synthesizer of claim 2, wherein the translation reference loop filter is not a surface acoustic wave filter.

4. The translation reference loop frequency synthesizer of claim 2, further comprising;
   a frequency synthesizer controller configured to select a value for the translation loop divisor such that a frequency of the translation reference loop divided signal is less than 2.5 GHz.

5. The translation reference loop frequency synthesizer of claim 2, wherein the phase lock loop circuit further comprises:
   a phase detector configured for generating a phase detector difference signal based on a phase difference between the phase lock reference signal and the phase lock feedback signal;
   a charge pump configured for generating a phase lock tuning signal based on the phase detector difference signal;
   a phase lock loop filter configured for generating a filtered phase lock tuning signal based on the phase lock tuning signal;
   a phase lock oscillator configured for generating the phase lock oscillator output signal based on the phase lock tuning signal; and
   a phase lock feedback divider configured for generating the phase lock feedback signal by dividing a frequency of the phase lock oscillator output signal by a feedback divisor.

6. The translation reference loop frequency synthesizer of claim 5,
   wherein the phase lock oscillator has multiple tuning bands and is configured for a frequency output range that covers a full octave in frequency steps less than 1 Hz.

7. The translation reference loop frequency synthesizer of claim 5, wherein the phase lock loop circuit further comprises:
   a phase lock output frequency doubler coupled between the phase lock oscillator and the series of the one or more translation loop dividers and configured for doubling the frequency of the phase lock oscillator output signal.

8. The translation reference loop frequency synthesizer of claim 5,
   wherein the translation reference loop filter and the phase lock loop filter are not surface acoustic wave filters.

9. The translation reference loop frequency synthesizer of claim 2, wherein the series of the one or more translation loop dividers further comprises:
   a first translation loop divider configured to divide the phase lock oscillator output signal by a first translation divisor;
   a second translation loop divider configured to divide the phase lock oscillator output signal by a second translation divisor; and
   wherein the translation loop divisor is the first translation divisor multiplied by the second translation divisor.

10. The translation reference loop frequency synthesizer of claim 9,
    wherein the first translation divisor is one of a set of 2 and 4; and
    wherein the second translation divisor is one of a set of 3, 4, 5 and 6.

11. The translation reference loop frequency synthesizer of claim 5, wherein the translation reference frequency generator further comprises:
    a translation reference oscillator configured for generating a translation reference oscillator signal;

a direct digital synthesizer configured for generating a direct digital synthesizer signal with a frequency based on a tuning word and a frequency of the translation reference oscillator signal;

a direct digital synthesizer filter configured to produce a filtered direct digital synthesizer signal based on the direct digital synthesizer signal;

a quadrature modulator configured for generating a modulated translation reference frequency signal based on mixing of a quadrature split of the filtered direct digital synthesizer signal with the translation reference oscillator signal; and a translation reference filter bank configured for generating the translation reference frequency signal by filtering the modulated translation reference frequency signal.

12. The translation reference loop frequency synthesizer of claim 11, a frequency synthesizer controller configured to set a first group of values for the frequency of the direct digital synthesizer, the phase lock feedback divider and the translation loop divisor that result in a first frequency for phase lock oscillator output signal; and wherein the frequency synthesizer controller is configured to set a second group of values for the frequency of the direct digital synthesizer, the phase lock feedback divider and the translation loop divisor that result in the first frequency for the phase lock oscillator output signal.

13. The translation reference loop frequency synthesizer of claim 11, wherein the direct digital synthesizer filter is a bandpass surface acoustic wave filter;

wherein the translation reference filter bank comprises a first translation reference bandpass filter in parallel with a second translation reference bandpass filter; and wherein the first translation reference bandpass filter and the second translation reference bandpass filter are both surface acoustic wave filters.

14. The translation reference loop frequency synthesizer of claim 13, wherein a passband of the first translation reference bandpass filter and a passband of the second translation reference bandpass filter are at least as wide as a tuning range of the direct digital synthesizer signal;

wherein the first translation reference bandpass filter has a passband center that is a sum of a center frequency of the translation reference oscillator signal and a center frequency of the tuning range the direct digital synthesizer signal; and wherein the second translation reference bandpass filter has a passband center that is a difference of the center frequencies of the translation reference oscillator signal and the tuning range the direct digital synthesizer signal.

15. The translation reference loop frequency synthesizer of claim 11, wherein the translation reference frequency generator further comprises:

a quadrature splitter coupled between the direct digital synthesizer filter and the quadrature modulator, the quadrature splitter configured for splitting the direct digital synthesizer signal into a first quadrature translation signal and a second quadrature translation signal; and an absorptive switch coupled between the direct digital synthesizer filter and the quadrature splitter, the absorptive switch configured for switching between a first switch configuration in which the first quadrature translation signal leads and the second quadrature translation signal lags and a second switch configuration in which the first quadrature translation signal lags and the second quadrature translation signal leads.

16. The translation reference loop frequency synthesizer of claim 11, wherein the phase lock oscillator has a frequency output range of 4 to 8 GHz;

wherein the direct digital synthesizer has a tuning range of 37 to 45 MHz; and wherein the translation reference oscillator is configured for generating a reference oscillator output signal of 1 GHz.

\* \* \* \* \*